(12) United States Patent
Bae et al.

(10) Patent No.: US 12,243,820 B2
(45) Date of Patent: Mar. 4, 2025

(54) SEMICONDUCTOR DEVICE WITH FINE METAL LINES FOR BEOL STRUCTURE AND METHOD OF MANUFACTURING THE SAME

(71) Applicant: SAMSUNG ELECTRONICS CO., LTD., Suwon-si (KR)

(72) Inventors: Taeyong Bae, Albany, NY (US); Hoonseok Seo, Niskayuna, NY (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/600,031

(22) Filed: Mar. 8, 2024

(65) Prior Publication Data

US 2024/0213155 A1 Jun. 27, 2024

Related U.S. Application Data

(62) Division of application No. 17/354,593, filed on Jun. 22, 2021, now Pat. No. 11,990,409.

(Continued)

(51) Int. Cl.
*H01L 21/768* (2006.01)
*H01L 23/522* (2006.01)
*H01L 23/528* (2006.01)

(52) U.S. Cl.
CPC .... *H01L 23/5283* (2013.01); *H01L 21/76877* (2013.01); *H01L 23/5226* (2013.01); *H01L 23/528* (2013.01)

(58) Field of Classification Search
CPC .......... H01L 21/28587–28593; H01L 23/49838–49844; H01L 29/41–42396; H01L 21/76816
See application file for complete search history.

(56) References Cited

U.S. PATENT DOCUMENTS 9,818,611 B2 11/2017 deVilliers
10,276,434 B1 * 4/2019 Chen ................... H01L 21/7688
(Continued)

OTHER PUBLICATIONS

Baert, Rogier et al., "Variability of Quadruple-Patterning Interconnect Processes", 2015 IEEE International Interconnect Technology Conference and 2015 IEEE Materials for Advanced Metallization Conference (IITC/MAM). May 18, 2015, pp. 135-138.

(Continued)

*Primary Examiner* — Eric A. Ward
*Assistant Examiner* — Nora T. Nix
(74) *Attorney, Agent, or Firm* — Sughrue Mion, PLLC

(57) ABSTRACT

Provided is a semiconductor device including a a front-end-of-line (FEOL) structure and a back-end-of-line (BEOL) structure connected to the FEOL structure, wherein the FEOL structure includes at least one source/drain region and at least one gate structure, and the BEOL structure includes: a plurality of $1^{st}$ fine metal lines arranged in a row with a same pitch, each of the plurality of $1^{st}$ fine metal lines having a same width; and at least one $1^{st}$ wide metal line formed at a side of the plurality of $1^{st}$ fine metal lines, the $1^{st}$ wide metal line having a width greater than the width of the $1^{st}$ fine metal line, and wherein each of the plurality of $1^{st}$ fine metal lines includes a material different from a material included in the $1^{st}$ wide metal line.

5 Claims, 9 Drawing Sheets

Related U.S. Application Data

(60) Provisional application No. 63/176,688, filed on Apr. 19, 2021.

(56) References Cited

U.S. PATENT DOCUMENTS

| | | |
|---|---|---|
| 2015/0371939 A1 | 12/2015 | Yang et al. |
| 2016/0268200 A1* | 9/2016 | Ishikura ................ H01L 23/528 |
| 2018/0174894 A1 | 6/2018 | Bouche et al. |
| 2019/0206725 A1 | 7/2019 | Chu et al. |
| 2020/0168458 A1 | 5/2020 | Liao et al. |
| 2020/0185375 A1 | 6/2020 | Kim |
| 2020/0373410 A1 | 11/2020 | Lee et al. |
| 2021/0193810 A1 | 6/2021 | Xu et al. |

OTHER PUBLICATIONS

Communication dated Sep. 16, 2022 issued by the European Patent Office in counterpart European Application No. 22168178.6.

Pan, David Z. et al., "Design for Manufacturing With Emerging Nanlithography", IEEE Transactions on Computer-Aided Design of Integrated Circuits and Systems, vol. 32, No. 10, Oct. 2003, pp. 1453-1472. (21 pages total).

Yijian Chen, Qi Cheng, Weiling Kang, Analysis of process characteristics of self-aligned multiple pattering, Microelectronic Engineering, vol. 98, 2012, pp. 184-188, ISSN 0167-9317 (Year: 2012).

* cited by examiner

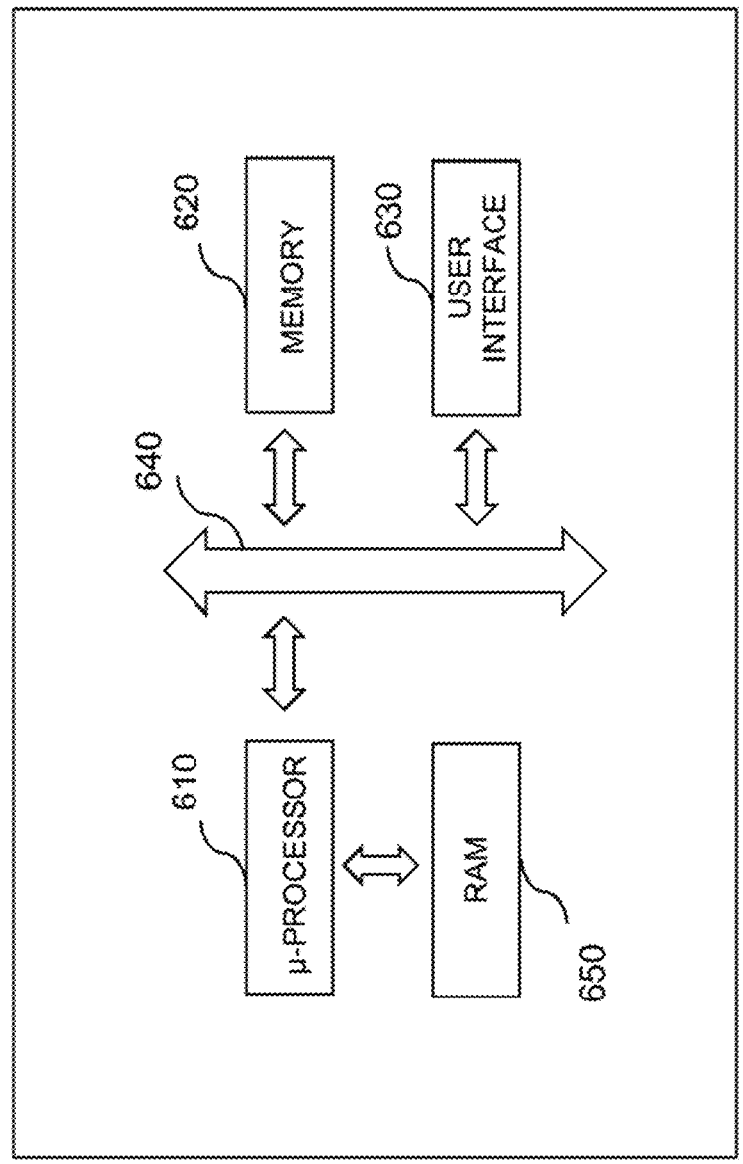

SEMICONDUCTOR DEVICE WITH FINE METAL LINES FOR BEOL STRUCTURE AND METHOD OF MANUFACTURING THE SAME

CROSS-REFERENCE TO THE RELATED APPLICATION

This is a Divisional Application of U.S. application Ser. No. 17/354,593 filed Jun. 22, 2021, which is based on and claims priority from U.S. Provisional Application No. 63/176,688 filed on Apr. 19, 2021 in the U.S. Patent and Trademark Office, the disclosure of which is incorporated herein in its entirety by reference.

BACKGROUND

1. Field

The disclosure provided herein relates to a semiconductor device including fine back-end-of-line (BEOL) patterns, and method of manufacturing the fine patterns for the semiconductor device.

2. Description of the Related Art

With increasing demand of a high-density semiconductor device, the size of BEOL structures included in the semiconductor device has been rapidly reduced. However, downsizing BEOL structures presents difficulties in fine patterning and achieving uniformity between small-pitch patterns. The BEOL structures refer to interconnect metal lines or via structures connecting transistors, capacitors, resistors, etc. with each other or outside circuits in a semiconductor device.

In a related-art subtractive etching operation, clogging may occur between at least between some of hardmask or spacer patterns formed above a metal layer to be etched, using the hardmask or spacer patterns, to form metal lines of a BEOL structure for a semiconductor device. For example, FIGS. 1A and 1B illustrate a later stage of a related-art subtractive etching such as self-aligned double patterning (SADP) or self-aligned quadruple patterning (SAQP) in which clogging prevents forming uniform fine metal lines for a semiconductor device.

Referring to FIG. 1A, a metal layer ML is formed on a semiconductor die or stack 100 with a base layer 101 therebetween, and a hardmask or spacer layer 110 formed on the metal layer ML is used to pattern a plurality of fine metal lines 105 from the metal layer ML (see FIG. 1B).

As shown in FIG. 1A, when the hardmask or spacer layer 110 formed above the metal layer ML is patterned down into the metal layer ML by etching, clogging may occur at, for example, some portions 111 of the patterned hardmask or spacer layer 110. It is known that this clogging may occur because of difficulty in obtaining a plurality of fine patterns from the hardmask or spacer layer 110 to correspond to the fine metal lines 105 to be formed therebelow. This is particularly so when the fine metal lines 105 have a high aspect ratio of thickness to height and a narrow space between the fine metal lines 105.

When the clogged hardmask or spacer layer 110 is used in direct-etching the metal layer ML, there is a high risk of failing to form spaces having a uniform width between fine metal lines 105 as shown in FIG. 1A. That is, the direct etching operation using the clogged hardmask or spacer layer 110 may generate spaces having different widths S1 and S2 between the fine metal lines 105. Consequently, when the patterned hardmask or space layer 110 from top surfaces of the fine metal lines 105 are removed, and the base layer 101 exposed at spaces between the fine metal lines 105 are removed, the resulting fine metal lines 105 may have different widths F1 and F2, as shown in FIG. 1B. Thus, the above method of patterning the fine metal lines 105 may not provide a desired uniform with or thickness required for a semiconductor device. Further, in some cases, shorts may occur between the non-uniform fine metal lines 105 shown in FIG. 1B because a metal material that should have been etched away between the non-uniform fine metal lines 105 is not in fact removed.

It is noted here that a BEOL structure including the fine metal lines 110F having non-uniform widths may not be correctly aligned with a middle-of-line (MOL) structure including source/drain contact structures or a gate contact structure and/or a frond-end-of-line (FEOL) structure including an active region, formed below the BEOL structure, thereby failing to manufacture a desired semiconductor device.

Information disclosed in this Background section has already been known to the inventors before achieving the embodiments of the present application or is technical information acquired in the process of achieving the embodiments. Therefore, it may contain information that does not form the prior art that is already known to the public.

SUMMARY

To address the above-described difficulties in pattering fine metal lines of a back-end-of-line (BEOL) structure of a semiconductor device, the disclosure provides a semiconductor device including a BEOL structure and a front-end-of-line (FEOL) structure, where fine metal lines and wide metal lines are differently formed based on different materials.

According to embodiments, there is provided a semiconductor device including an FEOL structure and a BEOL structure connected to the FEOL structure, wherein the FEOL structure includes at least one source/drain region and at least one gate structure, and the BEOL structure may include: a plurality of $1^{st}$ fine metal lines arranged in a row with a same pitch, each of the plurality of $1^{st}$ fine metal lines having a same width; and at least one $1^{st}$ wide metal line formed at a side of the plurality of $1^{st}$ fine metal lines, the $1^{st}$ wide metal line having a width greater than the width of the $1^{st}$ fine metal line. Here, each of the plurality of $1^{st}$ fine metal lines may include a material different from a material included in the $1^{st}$ wide metal line.

According to embodiments, there is provided a semiconductor device including an FEOL structure and a BEOL structure connected to the FEOL structure, wherein the FEOL structure includes at least one source/drain region and at least one gate structure, and the BEOL structure may include: a plurality of $1^{st}$ fine metal lines arranged in a row with a same pitch, each of the plurality of $1^{st}$ fine metal lines having a same width; and at least one $1^{st}$ wide metal line formed at a side of the plurality of $1^{st}$ fine metal lines, the $1^{st}$ wide metal line having a width greater than the width of the $1^{st}$ fine metal line. Here, the width of the $1^{st}$ wide metal line may be greater than twice the width of the $1^{st}$ fine metal line.

According to embodiments, there is provided a method of manufacturing a semiconductor device, wherein the method includes forming a front-end-of-line (FEOL) structure, and forming a back-end-of-line (BEOL) structure connected to the FEOL structure. Here, the forming the BEOL structure may include: forming a plurality of metal patterns having a same width on a base layer such that the plurality of metal patterns are disposed at a predetermined pitch; forming a spacer layer along outer surfaces of the plurality of metal patterns so that the spacer layer has a same thickness along the outer surfaces of the plurality of metal patterns; removing the spacer layer from top surfaces of the plurality of metal patterns such that the spacer layer remains as a plurality of spacers on side surfaces of the plurality of metal patterns; removing at least one of the plurality of metal patterns as a target metal pattern; forming plurality of spacers, that remain after the target metal pattern between the target spacers are removed, the other metal patterns with the other spacers on side surfaces thereof, so that the metal layer having a same thickness along the various patterns; removing the metal layer at top surfaces of the various patterns, and leaving the metal layer at side surfaces of the plurality of spacers including the target spacers; and removing the plurality of spacers including the target spacers, thereby obtaining a plurality of fine metal lines from the metal layers remaining between the plurality of spacers, and obtaining a plurality of wide metal lines from the plurality of metal patterns remaining between the plurality of spacers.

BRIEF DESCRIPTION OF THE DRAWINGS

Example embodiments will be more clearly understood from the following detailed description taken in conjunction with the accompanying drawings in which:

FIG. 6 illustrates a schematic block diagram of an electronic system according to an embodiment.

DETAILED DESCRIPTION OF THE EMBODIMENTS

Figure 1A:
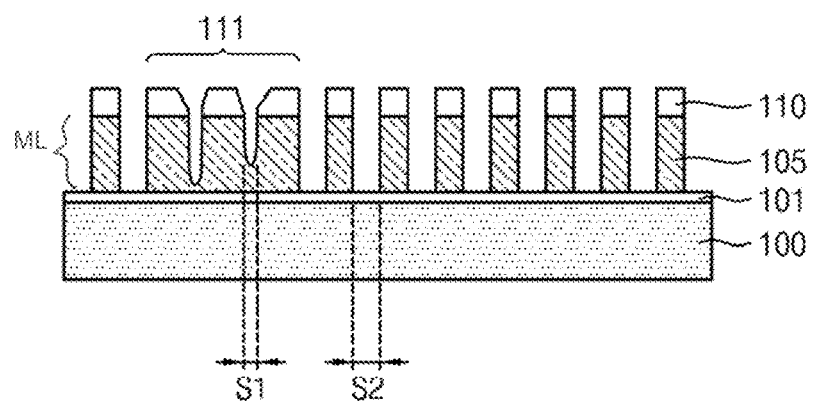
FIGS. 1A and 1B illustrate a later stage of a related-art subtractive etching in which clogging prevents forming uniform fine metal lines for a semiconductor device.
Figure 1B:
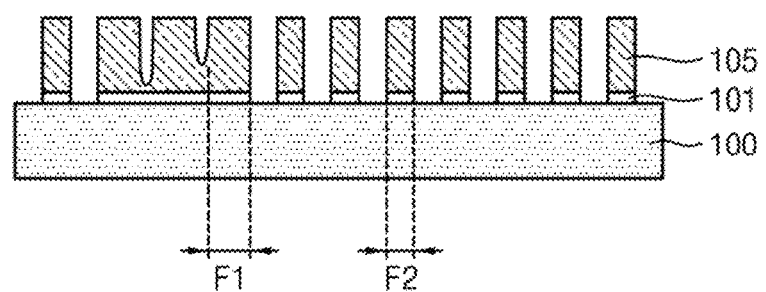

The embodiments described herein are all example embodiments, and thus, the inventive concept is not limited thereto, and may be realized in various other forms. Each of the embodiments provided in the following description is not excluded from being associated with one or more features of another example or another embodiment also provided herein or not provided herein but consistent with the inventive concept. For example, even if matters described in a specific example or embodiment are not described in a different example or embodiment thereto, the matters may be understood as being related to or combined with the different example or embodiment, unless otherwise mentioned in descriptions thereof. In addition, it should be understood that all descriptions of principles, aspects, examples, and embodiments of the inventive concept are intended to encompass structural and functional equivalents thereof. In addition, these equivalents should be understood as including not only currently well-known equivalents but also equivalents to be developed in the future, that is, all devices invented to perform the same functions regardless of the structures thereof. For example, a MOSFET described herein may take a different type or form of a transistor as long as the inventive concept can be applied thereto.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present.

In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly. In addition, terms such as a "row" and a "column" of an array, in which a plurality of semiconductor structures are arranged, may be interpreted as a "column" and a "row" when the array is rotated 90 degrees.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms $1^{st}$, $2^{nd}$, $3^{rd}$, $4^{th}$, etc. may be used herein to describe various elements (or layers), these elements should not be limited by these terms. These terms are only used to distinguish one element from another. Thus, a $1^{st}$ element described in a portion the specification could be termed a $2^{nd}$ element in another portion of the specification or claims without departing from the teachings of the inventive concept.

It will be also understood that, although in an embodiment of manufacturing an inventive apparatus or structure, a step or operation is described later than another step or operation, the step or operation may be performed later than the other step or operation unless the other step or operation is described as being performed after the step or operation.

Many embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

For the sake of brevity, conventional elements to a semiconductor device including a fin field-effect transistor (finFET) may or may not be described in detail herein when those elements are not related to the inventive concept. Further, even if those conventional elements are described, their specific structures or materials forming thereof may not be described herein when those structures or materials are not related to the inventive concept.

Herebelow, when a width of a certain layer or structure is mentioned, the width may refer to a horizontal width of the layer or structure.

FIGS. 2A-2K illustrate a method of forming a plurality of fine metal lines and wide metal lines of a BEOL structure in a semiconductor device, according to some embodiments. This method is also described in reference to a flowchart shown in FIG. 3. It is understood here that a plurality of operations of the method described herebelow and a plurality of sub-operations in each of the operations may not be limited to the order presented herein.

Figure 2A:
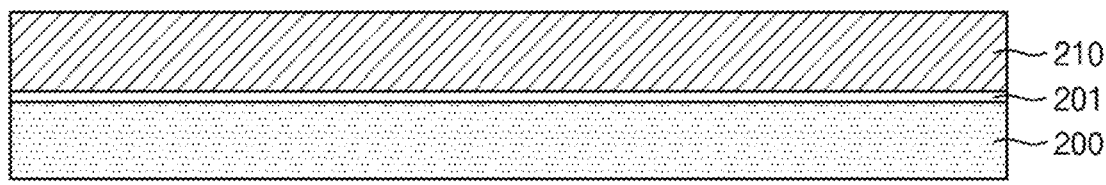
FIGS. 2A-2K illustrates a method of forming a plurality of fine metal lines and wide metal lines of a BEOL structure in a semiconductor device, according to embodiments.
Figure 3:
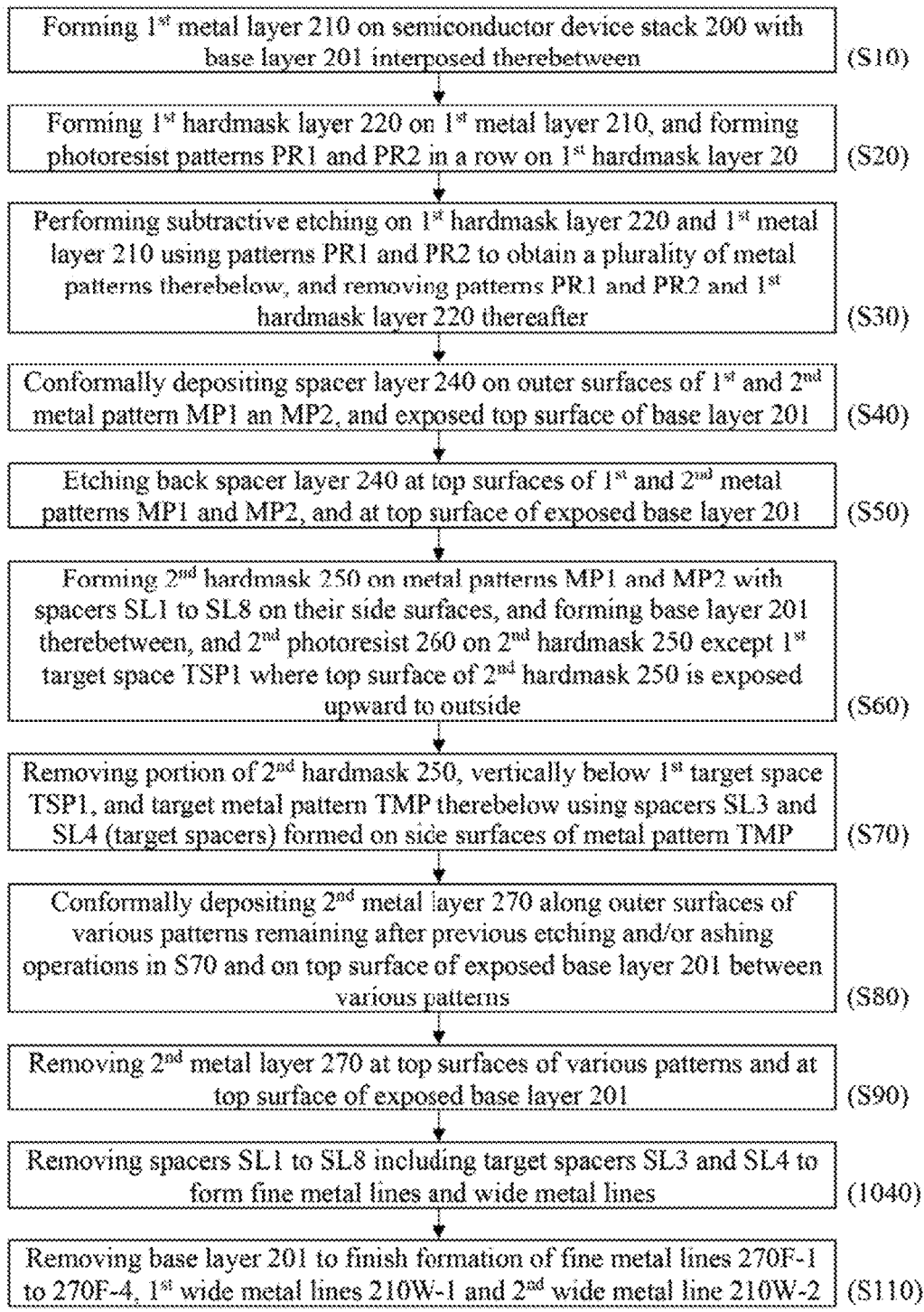
FIG. 3 illustrates a flowchart describing a method of forming a plurality of fine metal lines and wide metal lines of a BEOL structure in a semiconductor device, according to embodiments.

Referring to FIG. 2A, a $1^{st}$ metal layer 210 is formed on a semiconductor device stack 200 with a base layer 201 interposed therebetween, according to an embodiment (operation S10).

The $1^{st}$ metal layer 210 may include at least one of ruthenium (Ru), molybdenum (Mo), tungsten (W) and cobalt (Co), not being limited thereto. The formation of the $1^{st}$ metal layer 210 on the semiconductor device stack 200 and the base layer 201 may be performed by, for example, physical vapor deposition (PVD), not being limited thereto.

In a later operation, the $1^{st}$ metal layer 210 is to be patterned to form a plurality of wide metal lines of a back-end-of-line (BEOL) structure of the semiconductor device stack 200 that may also include a front-end-of-line (FEOL) structure and/or a middle-of-line (MOL) structure of one or more transistors. The FEOL structure may include source/drain regions and gate structures of the transistors, and the MOL structures may include source/drain contacts, gate contacts, via structures, etc. of the transistors. The one or more transistors may be planar transistors, finFETs, nanosheet transistors, and a combination thereof. However, the FEOL structure and the MOL structure of the semiconductor device stack 200 are not depicted in detail in FIGS. 2A to 2K as those structures are not necessary for understanding the embodiment disclosed herein.

The base layer 201 may include at least one of an insulation layer, an adhesive layer and an etch stop layer. The insulation layer may be formed of an oxide material such as silicon dioxide ($SiO_2$), the adhesive layer may be formed of amorphous silicon (a-Si), titanium nitride (TiN) or tantalum nitride (TaN), and the etch stop layer may be formed of aluminum nitride (AlN) and oxide doped carbide (ODC), not being limited thereto. The base layer 201 may be provided here for the purpose of adhesion of the $1^{st}$ metal layer 210 to the semiconductor device stack 200, nucleation of the $1^{st}$ metal layer 210 and/or etch stop of an etching process to be performed on the $1^{st}$ metal layer 210 in later operations.

Figure 2B:
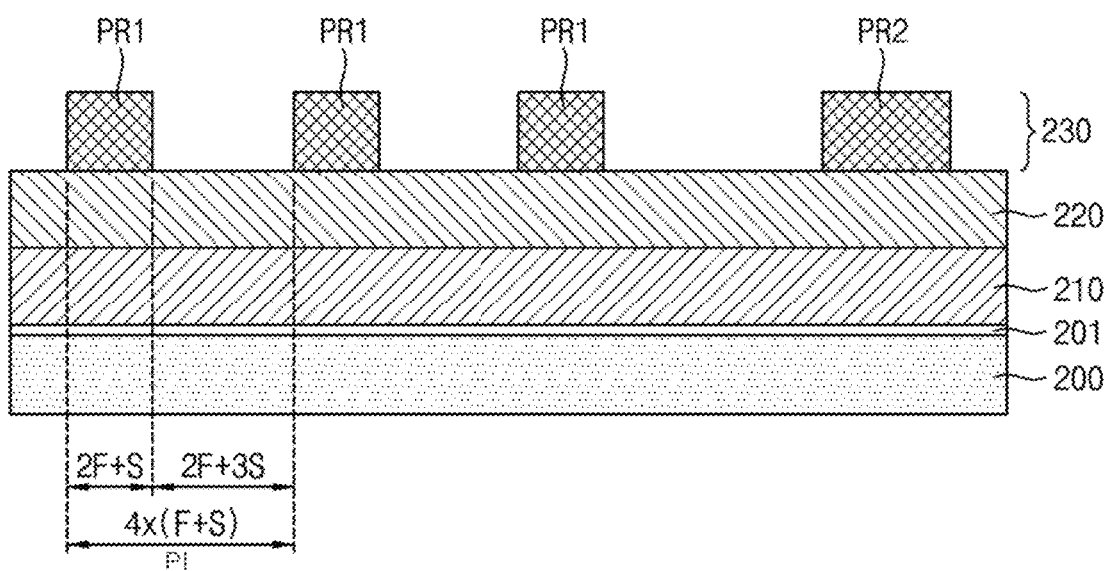

Referring to FIG. 2B, a $1^{st}$ hardmask layer 220 is formed on the $1^{st}$ metal layer 210, and a plurality photoresist patterns PR1 and PR2 are formed on the $1^{st}$ hardmask layer 20, according to an embodiment (operation S20).

In the present operation, the $1^{st}$ hardmask layer 220 may be formed first on the $1^{st}$ metal layer 210 and planarized, after which a $1^{st}$ photoresist 230 may be formed on the $1^{st}$ hardmask layer 220 and patterned to obtain a plurality of patterns shown as $1^{st}$ pattern PR1 and $2^{nd}$ pattern PR2 on the $1^{st}$ hardmask layer 220. The formation of the $1^{st}$ hardmask layer 220 and the $1^{st}$ photoresist 230 may be performed by at least one of PVD, chemical vapor deposition (CVD) and plasma-enhanced chemical vapor deposition (PECVD), not being limited thereto. The planarization of the $1^{st}$ hardmask layer 220 may be performed by chemical-mechanical polishing (CMP), not being limited thereto, and the $1^{st}$ patterns PR1 and the $2^{nd}$ patterns PR2 may be obtained through applying a $1^{st}$ photolithography process to the $1^{st}$ photoresist 230. Although FIG. 2B shows only three $1^{st}$ patterns PR1 and one $2^{nd}$ pattern PR2 are formed, the number of these patterns obtained through the $1^{st}$ photolithography process is not limited thereto.

The $1^{st}$ hardmask layer 220 may be formed of silicon oxynitride (SiON) or silicon dioxide ($SiO_2$), not being limited thereto, and the $1^{st}$ photoresist 230 may include an organic polymer resin containing a photoactive (light sensitive) material.

According to an embodiment, the $1^{st}$ photoresist 230 may be patterned such that the $1^{st}$ patterns PR1 having a same size are arranged in a row with a predetermined pitch PI therebetween. The predetermined pitch PI may be set to four times a sum of a width F of a fine metal line to be obtained in a later operation and a thickness S of a spacer layer to be used to pattern the fine metal line in a later operation, according to an embodiment. That is, the predetermined pitch PI may be represented by 4×(F+S), as shown in FIG. 2B. Here, the fine metal line is one of a plurality of fine metal lines that will form the BEOL structure for the semiconductor device stack 200 along with the wide metal lines to be patterned from the $1^{st}$ metal layer 210 in a later operation. It is noted that the thickness S of the spacer layer will define and be equal to a width S of a space between two adjacent fine metal lines among three or more fine metal lines to be arranged in a row at a uniform pitch to be described later. These three or more fine metal lines are included in the plurality of fine metal lines of the BEOL structure for the semiconductor device stack 200.

According to an embodiment, the $1^{st}$ photoresist 230 may also be patterned such that the $1^{st}$ patterns PR1, a space (or trench) therebetween, and the $2^{nd}$ pattern PR2 can have predetermined widths, respectively. For example, a width of each of the $1^{st}$ patterns PR1 may be set to a sum of two times the width F of the fine metal line and the thickness S of the spacer layer, that is, 2F+S, as shown in FIG. 2B. Further, a width of a space between the two adjacent $1^{st}$ patterns PR1 may be set to a sum of two times the width F of the fine metal line and three times the thickness S of the spacer layer, that is, 2F+3S. In addition, a width W of the $2^{nd}$ pattern PR2 may be set to be greater than the width of each of the $1^{st}$ patterns PR1 (which is 2F+S), and a width of a space between the $2^{nd}$ pattern PR2 and the closest $1^{st}$ pattern PR1 may be set to be greater than 2F+3S, not being limited thereto.

Here, it is noted that the width 2F+S of each of the $1^{st}$ patterns PR1 may define a width of each of $1^{st}$ wide metal lines that will be formed along with the fine metal lines as the BEOL structure for the semiconductor device stack 200 in a later operation. It is further noted that the width W of the $2^{nd}$ pattern PR2 may define a width of a $2^{nd}$ wide metal line that will also be formed along with the fine metal lines as the BEOL structure for the semiconductor device stack 200 in a later operation. Thus, according to design needs for the fine metal lines, the $1^{st}$ wide metal lines and the $2^{nd}$ wide metal line, the $1^{st}$ photoresist 230 may be differently patterned so that the width 2F+S of each of the $1^{st}$ patterns PR1 and the width W of the $2^{nd}$ pattern PR2 are different from the dimensions shown in FIG. 2B. For example, the width W of the $2^{nd}$ pattern PR2 may be set to be smaller than the width 2F+S of each of the $1^{st}$ patterns PR1 as long as the width W is set to be greater than the width F of the fine metal line.

Figure 2C:
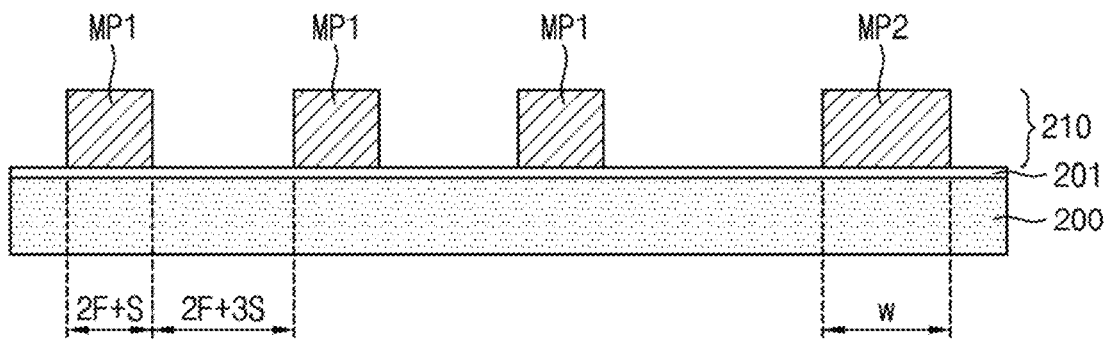

Referring to FIG. 2C, subtractive etching is performed on the $1^{st}$ hardmask layer 220 and the $1^{st}$ metal layer 210 using the patterns PR1 and PR2 shown in FIG. 2B to obtain a plurality of metal patterns therebelow, and the patterns PR1 and PR2 and the $1^{st}$ hardmask layer 220 are removed after the subtractive etching operation, according to an embodiment (operation S30).

The subtractive etching may be performed, for example, by dry etching and/or reactive ion etching (RIE) to obtain a plurality of metal patterns respectively corresponding to the $1^{st}$ patterns PR1 and the $2^{nd}$ pattern PR2 as shown in FIG. 2B. The subtractive etching also exposes a top surface of the base layer 201 between the plurality of metal patterns. Accordingly, FIG. 2C shows three $1^{st}$ metal patterns MP1 and one $2^{nd}$ metal pattern MP2 corresponding to the three $1^{st}$ patterns PR1 and one $2^{nd}$ pattern PR2, respectively, are formed on the base layer 201, and a top surface of the base layer 201 is exposed between the plurality of metal patterns.

It is noted here that the shapes of the $1^{st}$ patterns PR1 and the $2^{nd}$ pattern PR2 are transferred to the $1^{st}$ metal patterns MP1 and the $2^{nd}$ metal pattern MP2 through the above-described $1^{st}$ photolithography process and dry etching and/or wet etching operation. Thus, the $1^{st}$ metal patterns MP1 and the $2^{nd}$ metal pattern MP2 may have the same widths as the $1^{st}$ patterns PR1 and the $2^{nd}$ pattern PR2, respectively, and a space (or trench) formed between two adjacent $1^{st}$ metal patterns MP1 may have the same width as the space between two adjacent $1^{st}$ patterns PR1. Accordingly, the width of each of the $1^{st}$ metal patterns MP1 may be equal to the width 2F+S of each of the $1^{st}$ patterns, and the width of the space between the two adjacent $1^{st}$ metal patterns MP1 may be equal to the width 2F+3S of the space between the two adjacent $1^{st}$ patterns PR1. Further, the width of the $2^{nd}$ metal pattern MP2 may be equal to the width W of the $2^{nd}$ pattern PR2.

It is also noted that two of the three $1^{st}$ metal patterns MP1 and the one $2^{nd}$ metal pattern MP2 are provided here to form two $1^{st}$ wide metal lines and one $2^{nd}$ wide metal line of the BEOL structure for the semiconductor device stack 200, respectively, in a later operation to be described in reference to FIG. 2J. Thus, the width 2F+S of each of the $1^{st}$ metal patterns MP1 is to be the width of each of the $1^{st}$ wide metal lines, and the width W of the $2^{nd}$ metal pattern MP2 is to be the width of the $2^{nd}$ wide metal line.

Figure 2D:
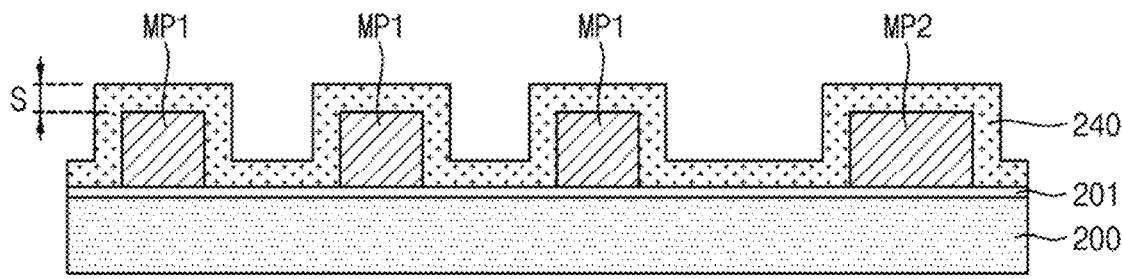

Referring to FIG. 2D, a spacer layer 240 is conformally deposited on outer surfaces of the $1^{st}$ metal patterns MP1 and the $2^{nd}$ metal pattern MP2, and the exposed top surface of the base layer 201, according to an embodiment (operation S40).

In this conformal deposition operation, the spacer layer 240 may be deposited using a thin film deposition technique such as atomic layer deposition (ALD) so that the spacer layer 140 can have the thickness S which is uniform along the outer surfaces of the $1^{st}$ metal patterns MP1 and the $2^{nd}$ metal pattern MP2, and the exposed top surface of the base layer 201, according to an embodiment. As noted above, the thickness S of the spacer layer 140 may be set to be equal to the width S of the space between two adjacent fine metal lines among three or more fine metal lines to be arranged in a row at a uniform pitch to be described later.

Further, in the present operation, the spacer layer 240 may be conformally deposited on the outer surfaces of the $1^{st}$ metal patterns MP1 and the $2^{nd}$ metal pattern MP2, and the exposed top surface of the base layer 201, without being disconnected, as shown in FIG. 2D, The spacer layer 240 may be formed of a material including silicon oxide (SiO) and/or silicon dioxide ($SiO_2$), not being limited thereto, as long as the material has etch selectivity against a material or layer deposited above the spacer layer 240 in later operations.

Figure 2E:
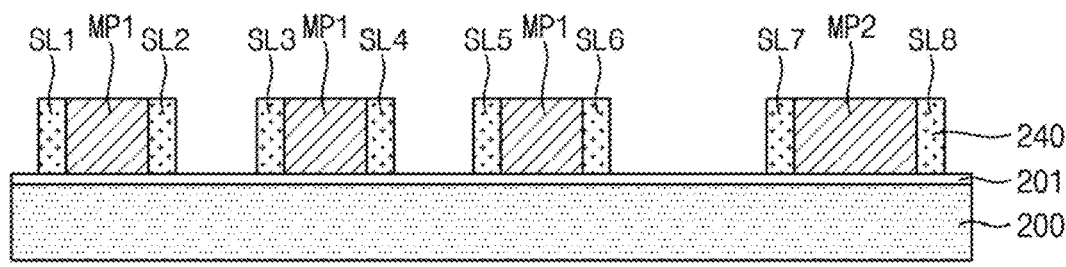

Referring to FIG. 2E, the spacer layer 240 is etched back by, for example, dry etching, at top surfaces of the $1^{st}$ metal patterns MP1 and the $2^{nd}$ metal pattern MP2, and at the top surface of the exposed base layer 201, according to an embodiment (operation S50).

However, after this etch-back operation performed on the spacer layer 240, the spacer layer 240 may still remain on side surfaces of the metal patterns MP1 and MP2 to expose the top surfaces thereof upward to the outside. The remaining spacer layer 240 includes spacers SL1 to SL6 formed on the side surfaces of the $1^{st}$ metal patterns MP1, and spacers SL7 and SL8 formed on the side surfaces of the $2^{nd}$ metal pattern MP2. A width S of each of these spacers SL7 and SL8 is equal to the thickness S of the spacer layer 240.

Further, by this etch-back operation, the top surfaces of the metal patterns MP1 and MP2 and top surfaces of the spacer layer 240 remaining on the side surfaces of the metal patterns MP1 and MP2 may become coplanar with each other.

Figure 2F:
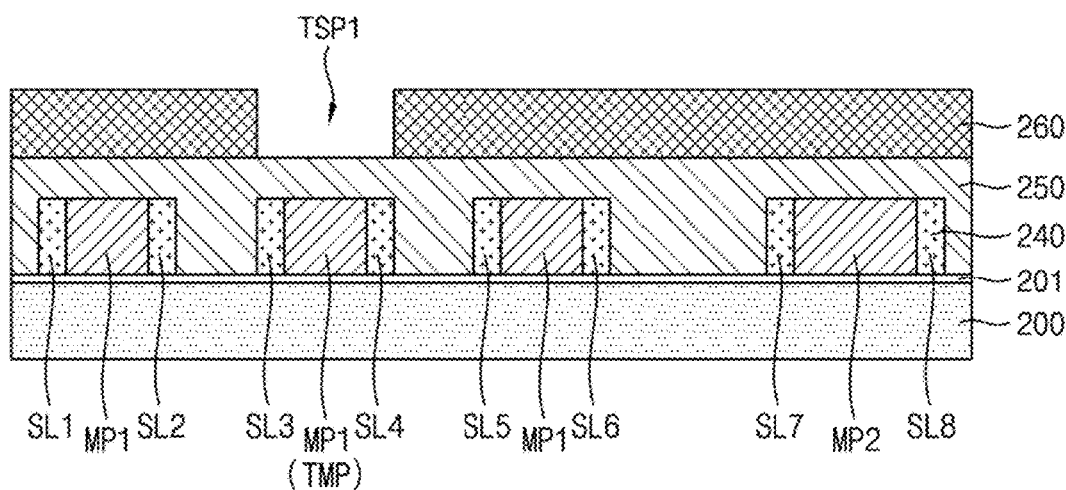

Referring to FIG. 2F, a $2^{nd}$ hardmask 250 is formed on the metal patterns MP1 and MP2 with the spacers SL1 to SL8 on their side surfaces, and the base layer 201 therebetween, and a $2^{nd}$ photoresist 260 is formed on the $2^{nd}$ hardmask 250 except a $1^{st}$ target space (or trench) TSP1 where a top surface of the $2^{nd}$ hardmask 250 is exposed upward to the outside, according to an embodiment (operation S60).

The $2^{nd}$ hardmask 250 formed on the metal patterns MP1 and MP2 may be a spin-on carbon (SOC) hardmask or a spin-on glass (SOG) hardmask, and the $2^{nd}$ photoresist 260 may be formed of the same material forming the $1^{st}$ photoresist 230 as describe in reference to FIG. 2B, according to embodiments.

Although not shown in FIG. 2F, the $2^{nd}$ hardmask 250 may be planarized at a top thereof after being formed on the metal patterns MP1 and MP2 with the spacers SL1 to SL8 on their side surfaces and the base layer 201 therebetween, according to an embodiment. The planarization may be performed by, for example, CMP, not being limited thereto. Subsequently, the $2^{nd}$ photoresist 260 may be formed on the planarized $2^{nd}$ hardmask 250, and a $2^{nd}$ photolithography process may be applied to the $2^{nd}$ photoresist 260 in a manner similar to the $1^{st}$ photolithography process applied to the $1^{st}$ photoresist 230 as shown in FIG. 2B. The $2^{nd}$ photolithography process may remove a portion of the 2$^{nd}$ photoresist 260 to form the 1$^{st}$ target space TSP 1 corresponding to a target metal pattern TMP, among the 1$^{st}$ metal patterns MP1, according to an embodiment. Here, the target metal pattern TMP is a metal pattern which is selected among the 1$^{st}$ metal patterns MP1 to be removed in a subsequent operation while the other metal patterns among the 1$^{st}$ metal patterns MP1 and the 2$^{nd}$ metal pattern MP2 are to become the wide metal lines of the BEOL structure. Thus, the 2$^{nd}$ photolithography process may be performed such that the 1$^{st}$ target space TSP1 is formed vertically above the target metal pattern TMP, according to an embodiment.

Figure 2G:
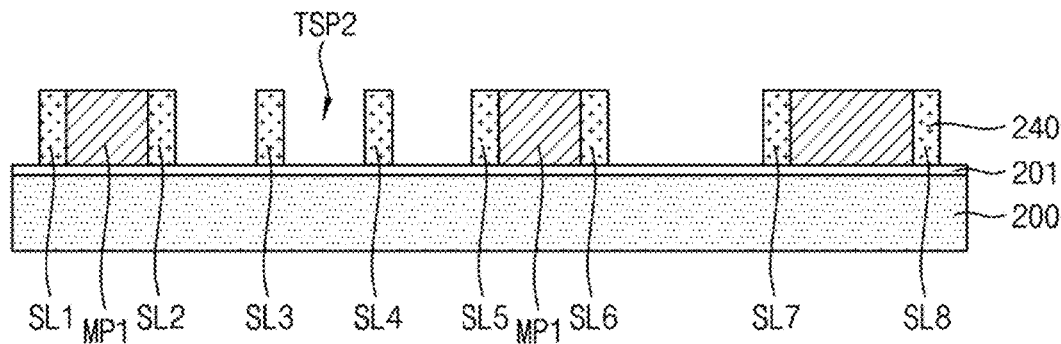

Referring to FIG. 2G, a portion of the 2$^{nd}$ hardmask 250, vertically below the 1$^{st}$ target space TSP1, and the target metal pattern TMP therebelow are removed using the spacers SL3 and SL4, hereafter referred to as target spacers, formed on the side surfaces of the target metal pattern TMP, according to an embodiment (operation S70).

In the present operation, the target spacers SL3 and SL4 may be used as a mask to remove the target metal pattern TMP between the target spacers SL3 and SL4 by, for example, dry etching and/or wet etching. In order to remove the target metal pattern TMP by dry etching and/or wet etching, the 1$^{st}$ target space TSP1 may have been formed in a previous operation to have a width greater than the width 2F+S of the target metal pattern TMP, which is the same as the width of each of the 1$^{st}$ metal patterns MP1, according to an embodiment.

With the target metal pattern TMP being removed, a 2$^{nd}$ target space (or trench) TSP2 having a width 2F+S equal to the width of the target metal pattern is formed between the target spacers SL3 and SL4. Further, the 2$^{nd}$ photoresist 260 and the 2$^{nd}$ hardmask 250 are removed by wet etching and/or ashing such as plasma ashing, not being limited thereto. As the 2$^{nd}$ hardmask 250 is removed, additional 2$^{nd}$ target spaces TSP2 having the same width 2F+S are formed at positions where the 2$^{nd}$ hardmask 250 is removed. The 2$^{nd}$ target spaces TSP2 refer to positions in which the fine metal lines are to be formed by conformal deposition of a metal layer in a later operation. It is noted here that a width of the 2$^{nd}$ target space TSP2 may be set to be greater than twice the width F of the fine metal line so that the metal layer forming the fine metal line can be conformally deposited inside the 2$^{nd}$ target space TSP2 obtained by removing the target metal pattern TMP without being overlapped in a later operation.

Figure 2H:
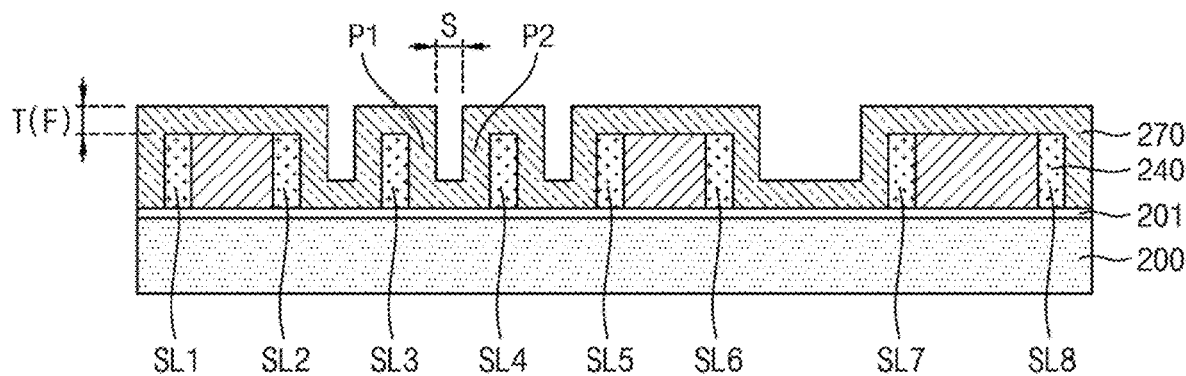

Referring to FIG. 2H, a 2$^{nd}$ metal layer 270 is conformally deposited along outer surfaces of various patterns remaining after the etching and/or ashing operations described in reference to FIGS. 2F and 2G, and on the top surface of the exposed base layer 201 between the various patterns, according to an embodiment (operation S80).

Here, the various patterns include the 1$^{st}$ metal patterns MP1 with the spacers SL1, SL2, SL5 and SL6 formed on their side surfaces, the 2$^{nd}$ metal pattern with the spacers SL7 and SL8 formed on its side surfaces, the target spacers SL3 and SL4. These various patterns take a form of a plurality of protrusions from the base layer 201 as shown in FIG. 2G. Hereafter, the 1$^{st}$ metal patterns MP1 remaining after the target metal pattern TMP is removed are referred to as remaining 1$^{st}$ metal patterns MP1.

According to an embodiment, the 2$^{nd}$ metal layer 270 may be conformally deposited by, for example, ALD or CVD, along outer surfaces of the various patterns so that a thickness of the 2$^{nd}$ metal layer 270 can be uniform along the outer surfaces of the various patterns to have a uniform thickness T. As will be described later, the conformally deposited 2$^{nd}$ metal layer 270 is to become the fine metal lines to be obtained to form the BEOL structure for the semiconductor device stack 200. Thus, the uniform thickness T of the 2$^{nd}$ metal layer 270 may define to be equal to the width F of the fine metal line.

When the 2$^{nd}$ metal layer 270 is conformally deposited along the outer surfaces of the various patterns in the present operation, the 2$^{nd}$ metal layer 270 may also be conformally deposited along the side surfaces of the target spacers SL3 and SL4 inside the 2$^{nd}$ target spaces TSP2 without filling the 2$^{nd}$ target space TSP2 as shown in FIGS. 2G and 2H. This conformal deposition can be enabled because the width of the 2$^{nd}$ target space TSP2 is set to be greater than twice the thickness T of the 2$^{nd}$ metal layer 270, as described earlier. Thus, two portions P1 and P2 of the 2$^{nd}$ metal layer 270 formed at the side surfaces of the target spacers SL3 and SL4 to face each other inside the 2$^{nd}$ target space TSP2 may not contact or overlap each other. Here, it is noted that the two portions P1 and P2 deposited on the side surfaces of the target spacers SL3 and SL4 inside the 2$^{nd}$ target space TSP2 along with portions P3 and P4 deposited on the other side surfaces of the target spacers SL3 and SL4 are to form a plurality of fine metal lines in a later operation.

It is also noted that a space between these two portions P1 and P2 of the 2$^{nd}$ metal layer 270 inside the 2$^{nd}$ target space TSP2 is defined by the thickness S of the spacer layer 240. In other words, if the thickness of the spacer layer 240 is set to be greater than S, which defines the widths of the patterns PR1, the target metal pattern TMP and the 2$^{nd}$ target space TSP2 as shown in FIGS. 2B to 2G, the two portions P1 and P2 of the 2$^{nd}$ metal layer 270 may contact or overlap each other when the 2$^{nd}$ metal layer 270 is deposited inside the 2$^{nd}$ target space TSP2, thereby preventing the conformal deposition inside the 2$^{nd}$ target space TSP2. Thus, the thickness S may be the minimum thickness that the spacer layer 240 may have so that the 2$^{nd}$ metal layer 270 may be conformally deposited inside the 2$^{nd}$ target space TSP2, according to an embodiment.

Moreover, the width F of the fine metal line, which is equal to the thickness T of the metal layer 270, also defines the widths of the patterns PR1, the target metal pattern TMP and the 2$^{nd}$ target space TSP2. If the thickness of the metal layer 270 is set to be greater than T when the thickness of the spacer layer 240 is set to S, the two portions P1 and P2 of the 2$^{nd}$ metal layer 270 may contact or overlap each other when the 2$^{nd}$ metal layer 270 is deposited inside the 2$^{nd}$ target space TSP2. In this case, the conformal deposition of the metal layer 270 inside the 2$^{nd}$ target space TSP2 may not be achieved, thereby to prevent obtaining a plurality of fine metal lines having a uniform width. Further, if the thickness of the metal layer 270 is set to be smaller than T when the thickness of the spacer layer 240 is set to S, a width of a space between the two portions P1 and P2 of the 2$^{nd}$ metal layer 270 may become greater than the thickness S of the spacer layer 240 which is equal to the width S of the space between two adjacent fine metal lines described above. In this case, spaces having a uniform width between the plurality of fine metal lines may not be achieved. Thus, the thickness T may be an optimal thickness that the 2$^{nd}$ metal layer 270 may have to achieve a uniform thickness and a uniform-width space for the plurality of fine metal lines, according to embodiments.

The 2$^{nd}$ metal layer 270 may be formed of at least one of ruthenium (Ru), molybdenum (Mo), tungsten (W) and cobalt (Co), not being limited thereto, that forms the 1$^{st}$ metal layer 210. However, according to an embodiment, the material forming the 2$^{nd}$ metal layer 270 may be different from that of the 2$^{nd}$ metal layer 210. For example, when the 1st metal layer 210 is formed of Ru, the 2$^{nd}$ metal layer 270 may be formed of Mo. Why differ?

Figure 2I:
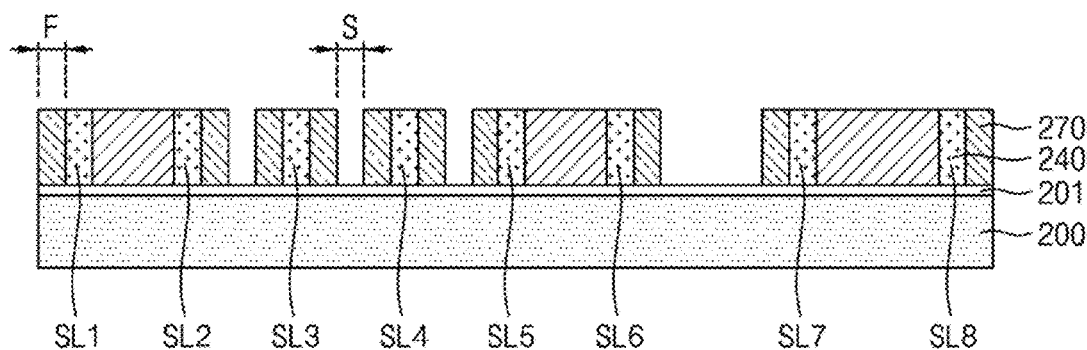

Referring to FIG. 2I, the 2$^{nd}$ metal layer 270 shown in FIG. 2H is removed at top surfaces of the various patterns described in the previous operation, and at the top surface of the exposed base layer 201, according to an embodiment (operation S90).

In the present operation, the 2$^{nd}$ metal layer 270 formed on the top surfaces of the various patterns and the base layer 201 may be etched back by, for example, dry etching, to expose the top surfaces of the various patterns and the base layer 201 upward to the outside. However, after the etch back operation, the 2$^{nd}$ metal layer 270 may still remain on the side surfaces of the target spacers SL3 and SL4, and on side surfaces of the spacers SL1, SL2 and SL5 to SL8 deposited on side surfaces of the remaining 1$^{st}$ metal patterns MP1 and the 2$^{nd}$ metal pattern MP2.

Figure 2J:
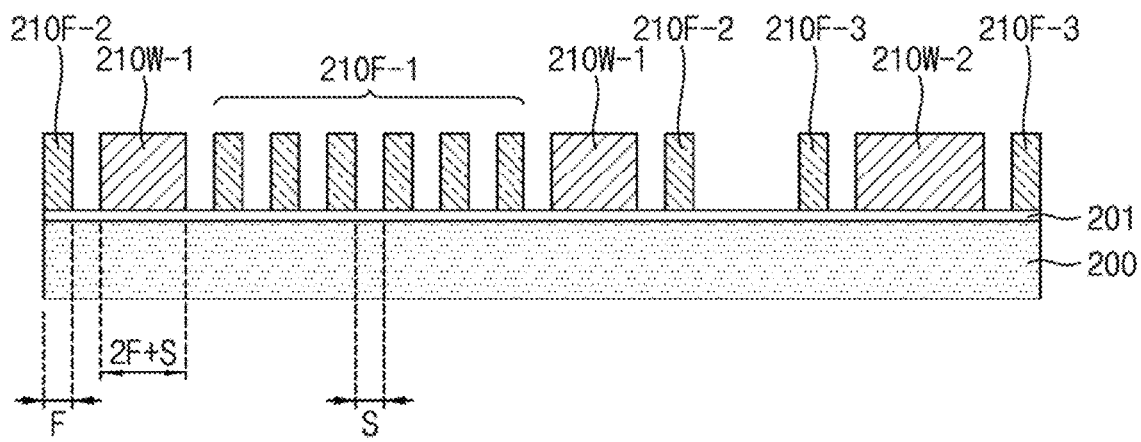

Referring to FIG. 2J, the spacers SL1 to SL8 including the target spacers SL3 and SL4 are removed to form a plurality of fine metal lines and wide metal lines, according to an embodiment (operation S100).

The spacers SL1 to SL8 including the target spacers SL3 and SL4 may be removed by, for example, dry etching and/or wet etching. By removing the spacers SL1 to SL8 including the target spacers SL3 and SL4 in the present operation, the 2$^{nd}$ metal layer 270 remaining on the side surfaces of the removed target spacers SL3 and SL4 may form four 1$^{st}$ fine metal lines 270F-1, which correspond to the three or more fine metal lines arranged in a row with a uniform pitch as described earlier. Also, the 2$^{nd}$ metal layer 270 remaining on the side surfaces of the removed spacers SL2 and SL5 facing the target spacers SL3 and SL4 may form additional two 1$^{st}$ fine metal lines 270F-1, while the 2$^{nd}$ metal layer 270 remaining on the side surfaces of the removed spacers SL1 and SL6 may form two 2$^{nd}$ fine metal lines 270F-2. Further, the 2$^{nd}$ metal layer 270 remaining on the side surfaces of the removed spacers SL7 and SL8 may form two 3$^{rd}$ fine metal lines 270F-3. Further, the remaining 1$^{st}$ metal patterns MP1 form a plurality of 1$^{st}$ wide metal lines, and the 2$^{nd}$ metal pattern MP2 form a 2$^{nd}$ wide meal line 210W-2.

Thus, the width F of each of the fine metal lines 270F-1, 270F-2 and 270F-3 may be equal to the thickness T of the 2$^{nd}$ metal layer 270. Further, the width of each of the 1$^{st}$ wide metal lines 210W-2 may be equal to the width 2F+S of each of the remaining 1$^{st}$ metal patterns MP1, and the width of the 2$^{nd}$ wide metal line 210W-2 may be equal to the width W of the 2$^{nd}$ metal pattern MP2. This is because, as described earlier, the remaining 1$^{st}$ metal patterns MP1 became the 1$^{st}$ wide metal lines 210W-1, and the 2$^{nd}$ metal pattern MP2 became the 2$^{nd}$ wide metal line 210W-2.

In addition, a width S of a space between any two adjacent fine metal lines among the 1$^{st}$ fine metal lines 270F-1 may be equal to the thickness S of the spacer layer 240. Further, a width of a space between each of the 1$^{st}$ wide metal lines 210W-1 and the closest 1$^{st}$ fine metal line among the 1$^{st}$ fine metal lines 270F-1 may also be equal to S. This is because each of the 1$^{st}$ wide metal lines 210W-1 and the closest 1$^{st}$ fine metal line are both formed in the additional 2$^{nd}$ target space TSP2 having the same width as the 2$^{nd}$ target space TSP2 in which two of the 1$^{st}$ fine metal lines 270F-1 are formed, as shown in FIGS. 2H to 2J. It is noted that a width of a space between each of the 1$^{st}$ wide metal lines 210W-1 and the closest 1$^{st}$ fine metal line among the 1$^{st}$ fine metal lines 270F-1 may also be equal to S, because this space is formed by removing the spacer SL2 or SL3 having the width S. Further, a width of a space between each of the 3$^{rd}$ fine metal lines 270F-3 and the 2$^{nd}$ wide metal line 210W-2 may also be equal to S, because this space is formed by removing the spacer SL7 or SL8 having the width S.

Thus, as shown in FIG. 2J, the 1$^{st}$ fine metal lines 270F-1 are arranged in a row with a uniform pitch, which is equal to F+S. Further, all of the fine metal lines 270F-1 to 270F-3 have a uniform width F, and the space between any two adjacent fine metal lines among the 1$^{st}$ fine metal lines 270F-1 has the uniform width S. However, a space between a 2$^{nd}$ fine metal line 270F-2 and a 3$^{rd}$ fine metal line 270F-3 adjacent to each other may have a greater width than the uniform width S.

Figure 2K:
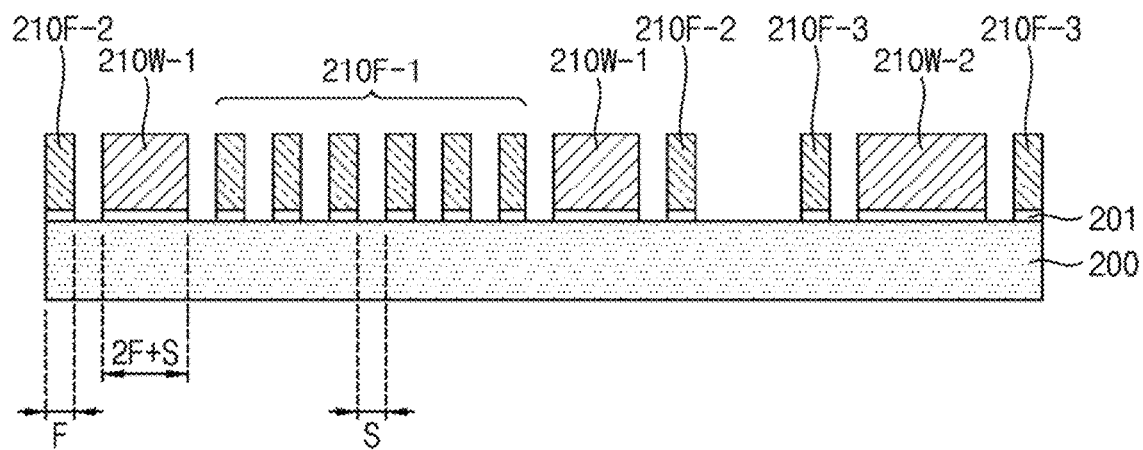

Referring to FIG. 2K, the base layer 201 is removed to finish formation of the fine metal lines 270F-1 to 270F-3, the 1$^{st}$ wide metal lines 210W-1 and the 2$^{nd}$ wide metal line 210W-2 of the BEOL structure for the semiconductor device stack 200, according to an embodiment (operation S110).

The base layer 201 may be removed at the spaces between the fine metal lines 270F-1, 270F-2, 270F-3, and the wide metal lines 210W-1 and 210W-2 by selective wet etching and cleaning, or dry etching, not being limited thereto, as shown in FIG. 2K according to an embodiment. However, the base layer 201 may still remain below the fine metal lines 270F-1, 270F-2, 270F-3, and the wide metal lines 210W-1 and 210W-2 for connection with the MOL structure of the semiconductor device stack 200 as will be described later in reference to FIG. 4.

In the above embodiments, the 1$^{st}$ metal layer 210, the 1$^{st}$ hardmask layer 220 and the plurality photoresist patterns PR1 and PR2 are formed on the semiconductor device stack 200 (FIGS. 2A and 2B) to pattern the BEOL structure of the semiconductor device stack 200. However, according to another embodiment, the 1$^{st}$ metal layer 210, the 1$^{st}$ hardmask layer 220 and the plurality photoresist patterns PR1 and PR2 may be formed separately, not on the semiconductor device stack 200, to pattern the BEOL structure, and the patterned BEOL structure may be bonded to the semiconductor device stack 200 later to form a semiconductor device.

As described above in reference to FIGS. 2A to 2K, the fine metal lines 270F and the wide metal lines 210W-1 and 210W-2 obtained through the operations shown in FIGS. 2A-2K may form the BEOL structure for the semiconductor device stack 200 which may include one or more of a planar transistor, a finFET, a nanosheet transistor, and a combination thereof. Thus, a following embodiment provides a schematic diagram of a semiconductor device in which the above-described BEOL structure including the fine metal lines 270F-1, 270F-2, 270F-3, and the wide metal lines 210W-1 and 210W-2 are interconnected to an MOL structure of the semiconductor device.

Figure 4:
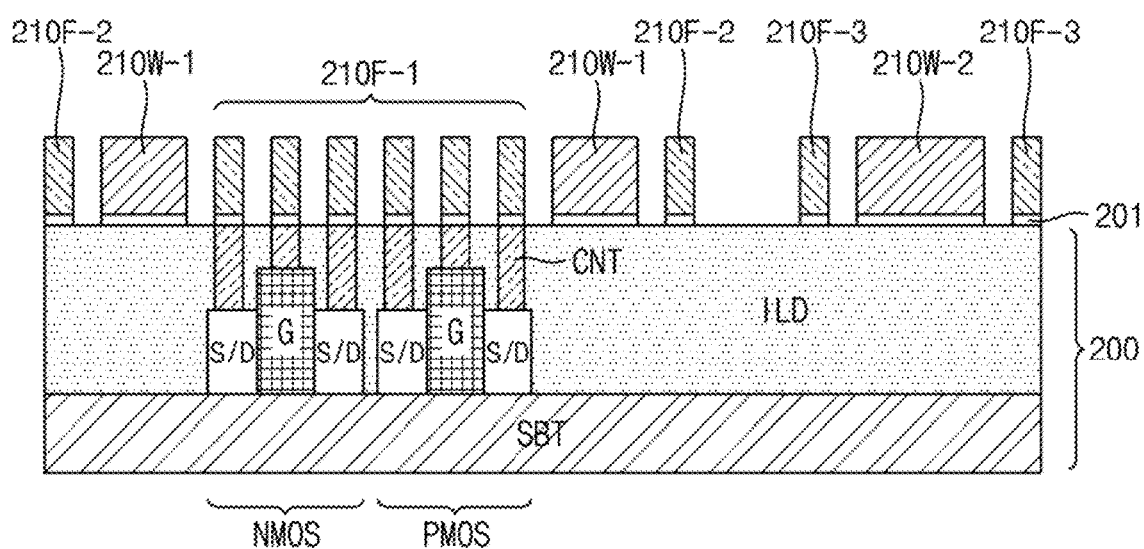
FIG. 4 illustrates a semiconductor device including a semiconductor device stack and a plurality of metal lines formed above the semiconductor device stack, according to an embodiment.

FIG. 4 illustrates a semiconductor device including a semiconductor device stack and a plurality of metal lines formed above the semiconductor device stack, according to an embodiment.

Referring to FIG. 4, a semiconductor device 40 includes the semiconductor device stack 200 and the plurality of metal lines shown in FIG. 2K.

According to an embodiment, the plurality of fine metal lines 270F-1, 270F-2 and 270F-3 arranged in a row with the predetermined same pitch are connected to an n-type finFET, which may be an n-type metal oxide semiconductor (NMOS), and a p-type finFET, which may be a p-type metal oxide semiconductor (PMOS) through an MOL structure. Specifically, the fine metal lines 210F arranged in a row with the predetermined same pitch are connected two source/drain regions and a gate structure of each of the NMOS and the PMOS through an MOL structure including corresponding source/drain contact structures and gate structures. According to an embodiment, the $1^{st}$ wide metal lines 210W-1 and 210W-2 may be respectively connected to a voltage source and a ground source through corresponding power lines (not shown).

FIG. 4 further shows that the other fine metal lines 210F and the $2^{nd}$ wide metal line are reserved for connection to another circuit element of the semiconductor device 40 or another semiconductor device.

As described above, a plurality of fine metal lines and a plurality of wide metal lines are obtained by a method different from the relate art etching operation. According to the embodiments, the fine metal lines are formed by performing conformal deposition, such as conformal CVD or ALD, of a metal layer along various patterns as shown in FIG. 2H, while the wide metal lines are formed by patterning a different metal layer though a photolithography process followed by dry etching and/or wet etching. Thus, unlike the related art fine metal line patterning that uses direct etching on a metal layer using a hardmask or layer that may cause a clogging problem, the above embodiments provide forming fine metal lines by simple conformal deposition that may avoid the clogging problem. Thus, the fine metal lines obtained according to embodiments may have a uniform thickness and a uniform space between a plurality of fine metal lines arranged in a row.

Figure 5:
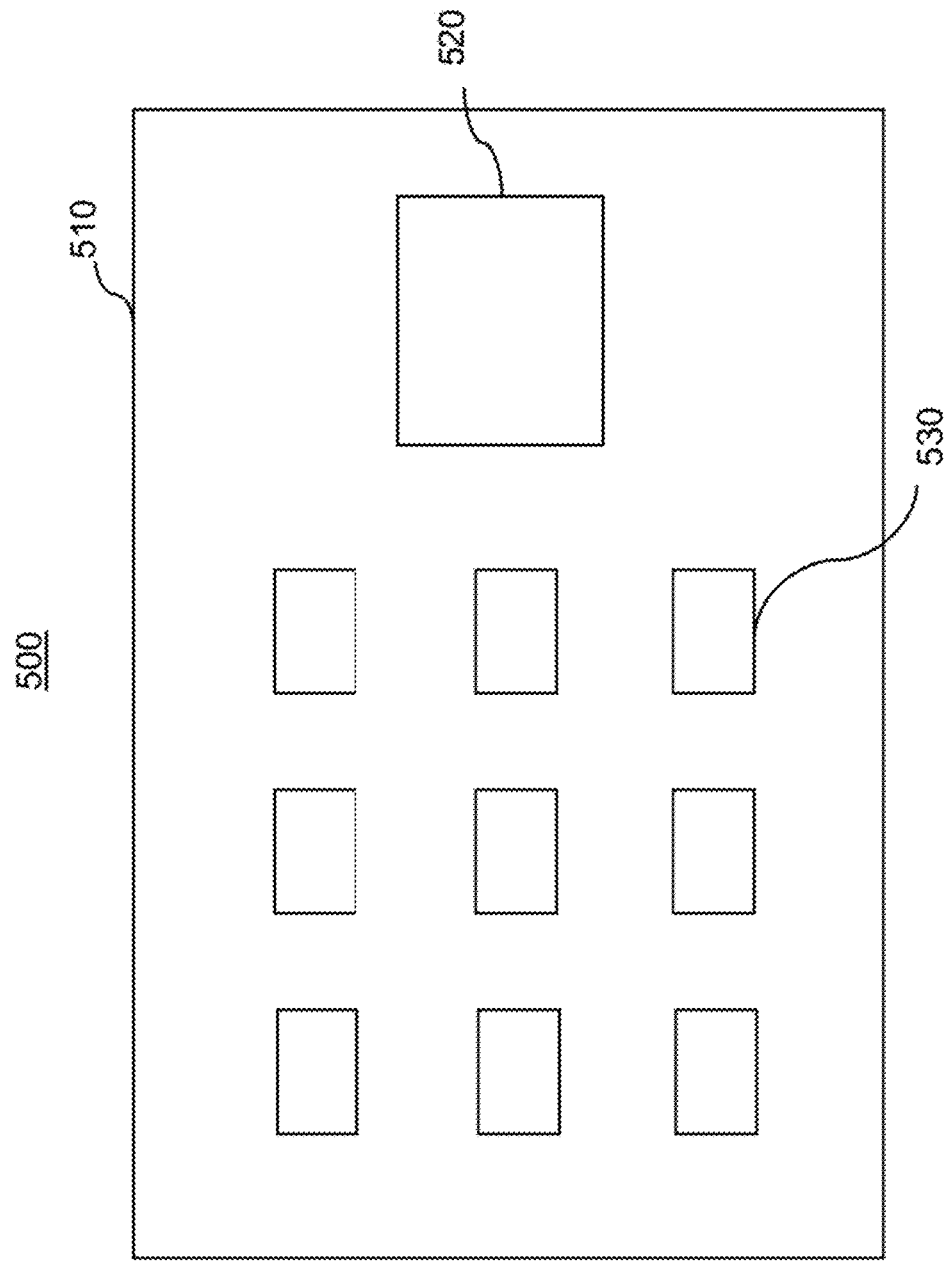
FIG. 5 illustrates a schematic plan view of an integrated chip (IC) according to an embodiment.

FIG. 5 illustrates a schematic plan view of an integrated chip (IC) according to an embodiment.

Referring to FIG. 5, an IC 500 according to an embodiment may include a processor 520 and semiconductor devices 530 that are mounted on a module substrate 510. The processor 520 and/or the semiconductor devices 530 may include the plurality of fine metal lines and at least one wide metal line described in the above embodiments.

FIG. 6 illustrates a schematic block diagram of an electronic system according to an embodiment.

Referring to FIG. 6, an electronic system 600 in accordance with an embodiment may include a microprocessor 610, a memory 620, and a user interface 630 that perform data communication using a bus 640. The microprocessor 610 may include a central processing unit (CPU) or an application processor (AP). The electronic system 600 may further include a random access memory (RAM) 650 in direct communication with the microprocessor 610. The microprocessor 610 and/or the RAM 650 may be implemented in a single module or package. The user interface 630 may be used to input data to the electronic system 600, or output data from the electronic system 600. For example, the user interface 630 may include a keyboard, a touch pad, a touch screen, a mouse, a scanner, a voice detector, a liquid crystal display (LCD), a micro light-emitting device (LED), an organic light-emitting diode (OLED) device, an active-matrix light-emitting diode (AMOLED) device, a printer, a lighting, or various other input/output devices without limitation. The memory 620 may store operational codes of the microprocessor 610, data processed by the microprocessor 610, or data received from an external device. The memory 620 may include a memory controller, a hard disk, or a solid state drive (SSD).

At least one of the microprocessor 610, the memory 620 and/or the RAM 650 in the electronic system 600 may include one or more of the multi-stack semiconductor devices described in at least one the above embodiments.

The foregoing is illustrative of example embodiments and is not to be construed as limiting thereof. Although a number of example embodiments have been described, those skilled in the art will readily appreciate that many modifications are possible in the above embodiments without materially departing from the inventive concept.

What is claimed is:

1. A method of manufacturing a semiconductor device, wherein the method comprises forming a front-end-of-line (FEOL) structure, and forming a back-end-of-line (BEOL) structure connected to the FEOL structure, and wherein the forming the BEOL structure comprises:
   forming a plurality of metal patterns having a same width on a base layer such that the plurality of metal patterns are disposed at a predetermined pitch;
   forming a spacer layer along outer surfaces of the plurality of metal patterns so that the spacer layer has a same thickness along the outer surfaces of the plurality of metal patterns;
   removing the spacer layer from top surfaces of the plurality of metal patterns such that the spacer layer remains as a plurality of spacers on side surfaces of the plurality of metal patterns;
   removing at least one of the plurality of metal patterns as a target metal pattern;
   forming a metal layer along outer surfaces of various patterns including target spacers, among the plurality of spacers, that remain after the target metal pattern between the target spacers are removed, and the other metal patterns with the other spacers on side surfaces thereof, so that the metal layer has a same thickness along the various patterns;
   removing the metal layer at top surfaces of the various patterns, and leaving the metal layer at side surfaces of the plurality of spacers including the target spacers; and
   removing the plurality of spacers including the target spacers, thereby obtaining a plurality of fine metal lines from the metal layer remaining between the plurality of spacers, and obtaining a plurality of wide metal lines from the plurality of metal patterns remaining between the plurality of spacers.

2. The method of claim 1, wherein forming each of the plurality of metal patterns comprises:
   depositing another metal layer on the base layer and a photoresist material on the other metal layer; and
   patterning the photoresist material and the other metal layer to obtain the plurality of metal patterns.

3. The method of claim 2, wherein the metal layer comprises a material different from a material included in the other metal layer.

4. The method of claim 2, wherein a width of each of the plurality of metal patterns is set to a sum of twice the thickness of the metal layer and the thickness of the spacer layer, and
   wherein a width of a space between two adjacent metal patterns among the plurality of metal patterns is set to a sum of twice the thickness of the metal layer and three times the thickness of the spacer layer.

5. The method of claim 1, wherein forming the spacer layer comprises: conformally depositing the spacer layer on the outer surfaces of the plurality of metal patterns, and
   wherein the thickness of the spacer layer is equal to a width of a space between two adjacent fine metal lines among the plurality of fine metal lines among the plurality of fine metal lines.

* * * * *